(12) United States Patent
Jensen (10) Patent No.: US 7,253,456 B2
(45) Date of Patent: Aug. 7, 2007

(54) DIODE STRUCTURE AND INTEGRAL POWER SWITCHING ARRANGEMENT

(75) Inventor: Nils Jensen, Munich (DE)

(73) Assignee: Infineon Technologies AG, Munich (DE)

( * ) Notice: Subject to any disclaimer, the term of this patent is extended or adjusted under 35 U.S.C. 154(b) by 271 days.

(21) Appl. No.: 10/976,436

(22) Filed: Oct. 29, 2004

(65) Prior Publication Data

US 2005/0104155 A1    May 19, 2005

(30) Foreign Application Priority Data

Oct. 31, 2003    (DE) ................................ 103 51 014

(51) Int. Cl.
*H01L 29/739* (2006.01)

(52) U.S. Cl. ........................ 257/199; 257/218; 257/229

(58) Field of Classification Search ................ 257/218, 257/199, 229
See application file for complete search history.

(56) References Cited

U.S. PATENT DOCUMENTS

| 4,862,310 A | 8/1989 | Harrington, III |
| 4,887,142 A | 12/1989 | Bertotti et al. |
| 6,242,763 B1 | 6/2001 | Chen et al. |
| 2002/0079554 A1 | 6/2002 | Okawa et al. |

FOREIGN PATENT DOCUMENTS

EP        0822596        8/1997

*Primary Examiner*—Douglas W. Owens
(74) *Attorney, Agent, or Firm*—Dicke, Billig & Czaja, PLLC

(57) ABSTRACT

A diode structure having high ESD stability is described. Other embodiments provide an integral power switching arrangement having an integrated low leakage diode.

21 Claims, 10 Drawing Sheets

FIG 1

PRIOR ART

FIG 2

PRIOR ART

DIODE STRUCTURE AND INTEGRAL POWER SWITCHING ARRANGEMENT

CROSS-REFERENCE TO RELATED APPLICATIONS

This Utility Patent Application claims priority to German Patent Application No. DE 103 51 014.1, filed on Oct. 31, 2003, which is incorporated herein by reference.

FIELD OF THE INVENTION

The invention relates to a diode structure having a first semiconductor region, which is formed in a semiconductor substrate, with a basic doping of a first conductivity type, a second semiconductor region, which adjoins the first semiconductor region, of a second conductivity type which is the opposite of the first conductivity type, a third semiconductor region, which adjoins the second semiconductor region, of the first conductivity type, and at least one first inner contact region, which is formed within the first semiconductor region and adjoins a substrate surface of the semiconductor substrate, with a contact doping of the first conductivity type which is higher than the basic doping. The invention also relates to an integral power switching arrangement with a low leakage diode.

BACKGROUND

Semiconductor power switches are provided, by way of example, as high-side switching elements between a DC motor as an inductive load, on the one hand, and the positive supply voltage or as low-side switching elements between the inductive load and the negative supply voltage.

Figure 1:
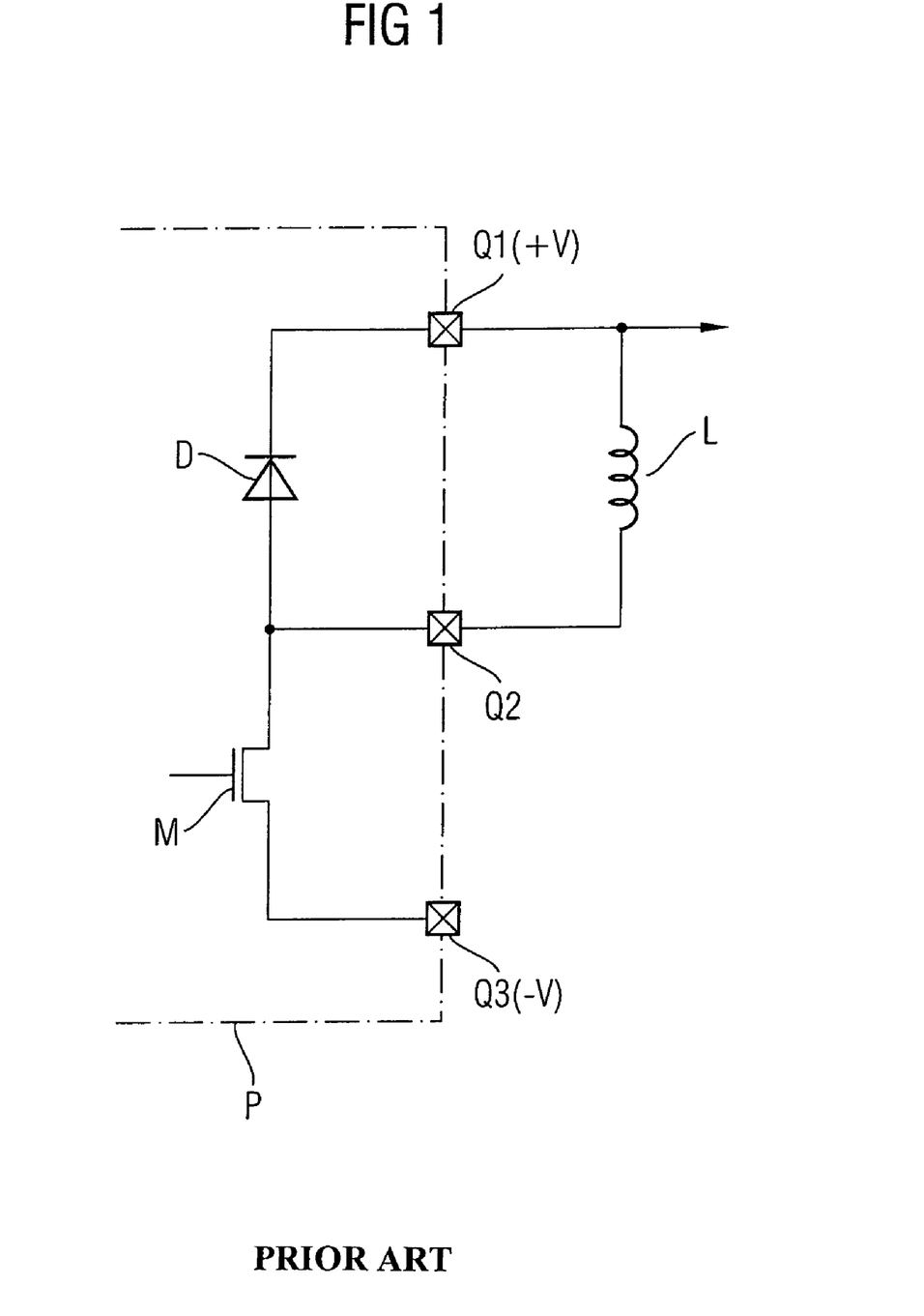
FIG. 1 illustrates a circuit arrangement with a low-side switch and a freewheeling diode.

As FIG. 1 shows, low-side power switches actuate an inductive load L using freewheeling diodes D which open a current path for the current through the inductance L to decay when a current path through the low-side switch and the inductive load L arranged in series with the low-side switch is disconnected. In the simplest case of actuating the inductive load L, the network node Q1 is connected to a positive supply voltage +V and a further connection Q3 is connected to a negative supply voltage −V or GND.

In more recent designs, both the freewheeling diode D and the power switch M are provided as an integral power switching arrangement SPT in the same semiconductor substrate in this case. The connections of the integral power switching arrangement P are routed to the network nodes Q1, Q2 and Q3.

Regardless of whether the freewheeling diode D is in the form of a discrete component or a diode structure D integrated into the integral power switching arrangement P, its connections are externally accessible in the case of transport and therefore need to be provided in a form protected against electrostatic loading (ESD, electrostatic discharge).

In conventional integral power switching arrangements with an integrated freewheeling diode, the low-side switch and the freewheeling diode, for example, are formed in n-doped well structures. The n-doped well structures are supported by a base substrate provided with a p-basic doping and are insulated from one another by vertical p-doped isolating sinker structures. In the case of a diode, the n-well can form a cathode. The anode is formed by a p-doped well which is enclosed by the n-well in the region of the semiconductor substrate. The p-well, the n-well enclosing the p-well and the p-doped base substrate form a pnp-substrate structure.

When the diode structure is operated in the forward direction, a charge carrier current flows from the inner p-well to the n-well. A significant part thereof is not collected directly by the cathode but rather enters the base substrate through the n-well. The base substrate has comparatively high resistance on account of the low doping and is normally connected to the negative supply potential or to GND potential. As a result, just an anode voltage of several volts with respect to the negative supply potential is sufficient to substantiate a disadvantageous comparatively high thermal power loss from the diode structure. In addition, the voltage drop in the base substrate actuates and activates a further parasitic npn-transistor formed by two respective adjacent n-wells and the intermediate portion of the base substrate, so that additional transport of charge carriers between the two adjacent n-wells is initiated.

Such a diode structure requires complex guard rings and substrate connections (which need to be formed in suitable fashion) in order to effectively remove charge carriers or holes transferred to the base substrate by the parasitic substrate transistor.

A further effect which results in charge carriers entering the base, substrate is the parallel-path current case. The parallel-path current case arises, by way of example, when a drain voltage in a power switching element, for example a DMOSFET (diffused metal oxide semiconductor field effect transistor), falls below the potential of the base substrate. In this case, electrons are injected into the base substrate from the DMOSFET's drain structure and are collected in part by adjacent n-wells.

A drawback of the described form of the diode is accordingly particularly the high thermal power loss as a result of the high substrate current in the diode's on-state mode, and also a current induced by an npn-substrate transistor between adjacent n-wells.

Figure 2:
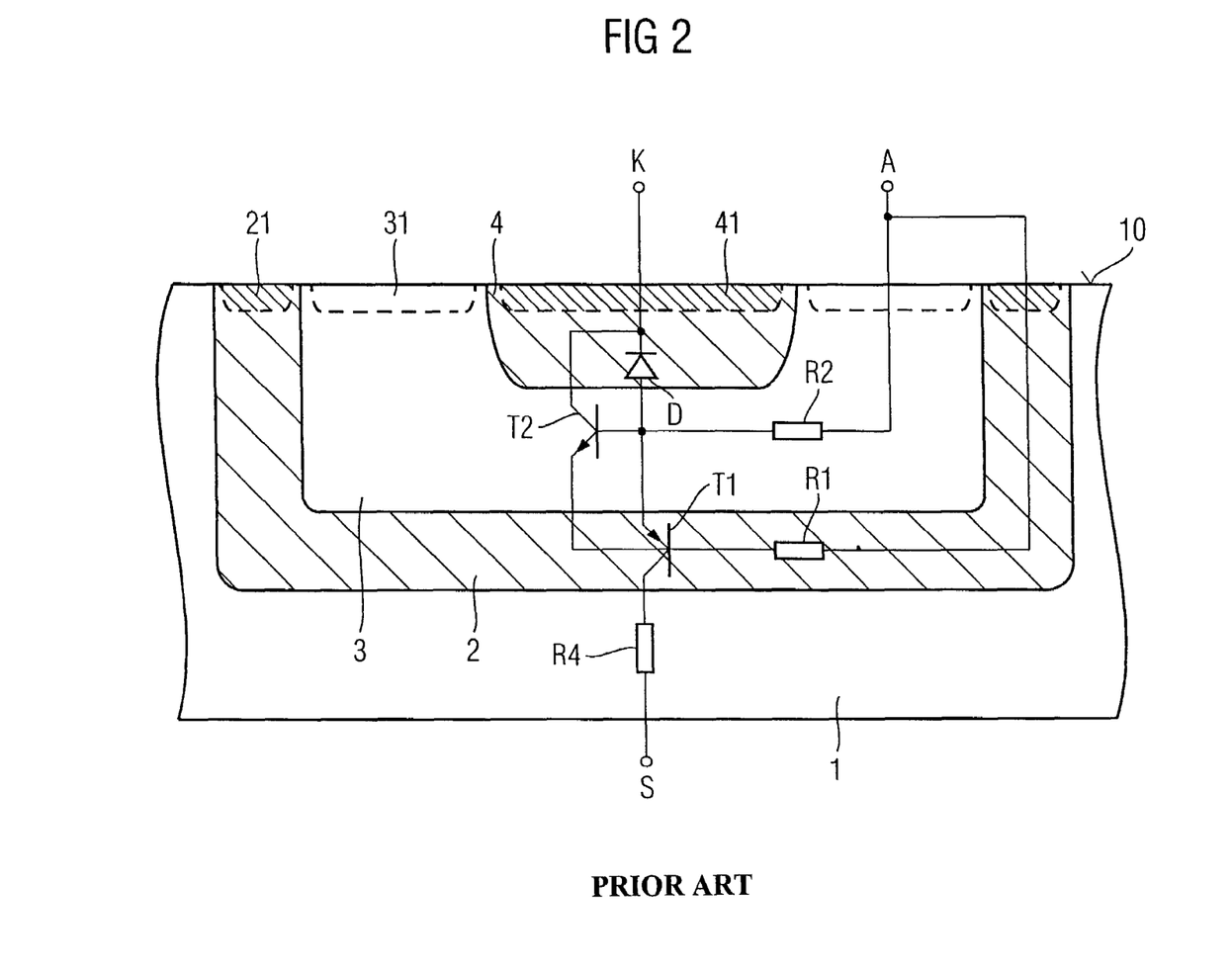
FIG. 2 illustrates a schematic cross section through a conventional low leakage diode integrated into an integral power switching arrangement.

An alternative arrangement, in which the high gain of the substrate transistor is advantageously reduced, is the form of the diode as a low leakage diode. A conventional low leakage diode is shown in FIG. 2 in greatly simplified cross section. The cross section has been overlaid by a schematic illustration of an equivalent circuit diagram of the real low leakage diode.

The pn-junction of the diode D is formed between an inner, n-doped well 4 and a central, p-doped well 3. The diode formed from the two wells 4, 3 is for its part embedded in a highly n-doped, outer well 2 and is isolated from a surrounding p-conductive structure 6 in the semiconductor substrate 1 by the outer well 2. In a portion which adjoins the substrate surface 10, the inner well 4 has an inner contact region 41 with an n-doping which is higher than a basic doping in the inner well 4. Similarly, a central contact region 31 which is highly p-doped in comparison with the surrounding central well 3 is formed in that portion of the central well 3 which is close to the surface, and an outer contact region 21 which is highly n-doped is formed in that portion of the outer well 2 which adjoins the substrate surface 10. The inner contact region 41 is connected to a cathode connection K. An anode connection A is formed in the region of the central contact regions 31. Contact is made with the outer well 2 in the region of the outer contact regions 21, said outer well 2 being connected to the anode connection and being placed at the anode potential in the exemplary embodiment shown.

The outer n-well 2 needs to be connected to the same potential as the central p-well 3. When the diode structure is in the on-state mode, charge carriers passing through the central well are soaked up by the outer n-well. In the parallel-path current case, the pn-junction between the central well and the outer well is always blocked and the charge carriers are offloaded via the outer well's connection.

In addition, the equivalent circuit diagram shows a parasitic npn-well transistor T2 which is actuated via the bulk resistance R2 of the central, p-conductive well 3 and acts between the inner, n-conductive well 4 and the outer, n-conductive well 2.

It has been found that the diode structure described in FIG. 2 has, in practice, a low stability with respect to electrostatic loading on the cathode and anode connections.

SUMMARY

Embodiments of the present invention provide a diode structure having high ESD stability. Other embodiments provide an integral power switching arrangement having an integrated low leakage diode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a diode structure having high ESD stability. Embodiments of the invention also provide an integral power switching arrangement with an integrated low leakage diode.

The invention is initially based on the analysis of the mechanisms which result in the failure of a conventional low leakage diode under ESD loading. In this case, a diode structure is assumed which has a first semiconductor region, which is formed in a semiconductor substrate, with a basic doping of a first conductivity type. The first semiconductor region is adjoined by a second semiconductor region of a second conductivity type which is the opposite of the first conductivity type, and the second semiconductor region is adjoined by a third semiconductor region of the first conductivity type. Within the first semiconductor region, a first inner contact region, which adjoins a substrate surface of the semiconductor substrate, with a contact doping of the first conductivity type which is higher than the basic doping is formed.

In the text below, reference is made by way of example to a diode structure in which the first conductivity type is the n conductivity type. In this case, a cathode connection on the diode structure is connected to the inner contact region, and in the real diode structure a parasitic npn-transistor structure is formed which acts between the first and third semiconductor regions and is controlled by a bulk resistance of the second semiconductor region when ESD loading acts in the diode structure's reverse direction.

When a fast, short current pulse equivalent to simulated ESD loading is applied to the cathode connection, triggering the parasitic npn-transistor results in the displacement of a maximum for an electrical field in the region of the junction between the highly n-doped inner contact region and the adjoining more weakly n-doped first semiconductor region in the direction of a region of the junction which is close to the surface.

On the basis of a distance from the anode connection, different voltage conditions arise within the parasitic npn-transistor's structure of planar construction. The base of the npn-transistor has the highest bias in the portion which is furthest away from the anode, which means that the greatest current density arises in a central region of the diode structure in the case of the diode structure shown in FIG. 2, for example. In this case, the current density is highest in a portion of the central region which is directly adjacent to a substrate surface of the semiconductor substrate. The resultant heat loss is dissipated only poorly via a structure, typically an oxide, which is supported by the semiconductor substrate.

In this case, migration of the current distribution in that region of the junction between the inner contact region and the first semiconductor region which is close to the surface can be attributed to the temperature dependency of the avalanche coefficient. Overall, the current in the case of ESD loading is supplied by the avalanche mechanism in the region where the inner contact region joins the first semiconductor region. The generation of charge carriers which underlies the avalanche mechanism decreases greatly as the temperature of the semiconductor substrate increases. For that reason, a portion of the current which can be associated with the avalanche mechanism moves to colder regions. The colder regions are initially the outer, superficial regions of the junction between the inner contact structure and the first semiconductor region. At that point, the diode structure is thermally destroyed as time progresses.

In another aspect of the invention, a design measure is taken which counteracts the mechanism which leads to the destruction of the diode in the case of ESD loading.

In a diode structure of the type mentioned at the outset, the first inner contact region with the conductivity type of the adjacent first semiconductor region is supplemented by second inner contact regions which have a doping which is the opposite of that in the first semiconductor region. In this case, an opposite doping is a doping of a conductivity type which is the opposite of the respective other conductivity type.

The second inner contact region of the second conductivity type forms an additional parasitic contact transistor which acts between the second inner contact region and the second semiconductor region and is controlled by a bulk resistance in the first semiconductor region.

For the aforementioned case of an n-conductive first semiconductor region, the second inner contact region is p-conductive. The additional parasitic pnp-contact transistor is activated by the thyristor effect in addition to the parasitic npn-well transistor. The injection of holes into the second semiconductor region adjoining the first semiconductor region pushes the electrical field in the transition region between the inner contact regions and the first semiconductor region deeper into the semiconductor substrate. This means that the center of a heating action develops at a greater distance from the substrate surface and deeper in the semiconductor substrate. This results in better dissipation of heat into the surrounding semiconductor substrate. In addition, the maximum field strength in the semiconductor substrate and hence the energy converted to heat do not reach the maximum values such as arise for an equivalent conventional diode structure. Both mechanisms advantageously prevent destruction of the component.

The second inner contact region advantageously adjoins the substrate surface of the semiconductor substrate and is connected to a first connection on the diode structure in the same way as the first inner contact region. The second semiconductor region is connected to a second connection on the diode structure. In this arrangement, one of the two connections needs to be operated as a cathode connection and the respective other connection needs to be operated as an anode connection.

The first semiconductor region is in the form of at least one inner well which is enclosed in the semiconductor substrate by the second semiconductor region, and the second semiconductor region is preferably in the form of at least one central well which is enclosed in the semiconductor substrate by the third semiconductor region. In one preferred embodiment, the third semiconductor region adjoins a base substrate of the second conductivity type.

Each central well may have a plurality of inner wells, and each outer well may have a plurality of central wells. Each well may be provided with a plurality of subregions having different levels of doping.

In one advantageous embodiment of the inventive diode structure, the third semiconductor region is connected to the second connection, which is also connected to the second semiconductor region or the central well. With regard to the arrangement of the two inner contact regions, the second inner contact region is advantageously surrounded, in a portion which adjoins the substrate surface, by the first inner contact region, or the first inner contact region is advantageously surrounded by the second inner contact region.

In another embodiment of the inventive diode structure, the first and second inner contact regions respectively comprise a plurality of subregions. A subregion of the first inner contact region and a subregion of the second inner contact region respectively form a cell structure which is repeated along at least one of the surface area axes of the substrate surface. In this embodiment, subregions which form a single cell structure may respectively enclose one another or adjoin one another.

In line with a further embodiment of the inventive diode structure, at least the first or the second inner contact region comprises a plurality of subregions. Starting from a first subregion of one of the two inner contact regions, a respective subregion of one inner contact region successively surrounds a subregion of the respective other inner contact region in the manner of a shell.

Starting from a circular or hexagonal first subregion, the subsequent subregions respectively surround the preceding other subregions in annular fashion, with the conductivity type of successive subregions respectively alternating.

The inventive diode structure can easily be scaled for current-carrying capacity by connecting identical single diode structures in parallel.

Preferably, the first conductivity type is the n conductivity type.

The inventive diode structure may be provided either as a discrete diode component or integrated into a power switching arrangement.

In this embodiment, a power switching arrangement comprises one or more transistor structures which are respectively formed within a first well structure, which is supported by a base substrate of a second conductivity type, of a first conductivity type which is the opposite of the second conductivity type. In addition, the power switching arrangement comprises one or more diode structures which are respectively provided within a second well structure of the first conductivity type which is provided on the base substrate. Isolating structures of the second conductivity type which are respectively vertical to the base substrate are provided between the well structures.

The invention provides at least one of the diode structures formed in the second well structure in the form of an inventive diode structure as described above, the well structure being formed by the outer well or the third semiconductor region of the inventive diode structure.

Portions of the outer well are preferably formed from a buried layer which is formed between a bottom edge of the central well and the underlying base substrate. Further portions of the outer well are formed by vertical outer sinker structures which are made in a process layer, which is grown epitaxially on the base substrate, from a substrate surface.

In one embodiment, the doping of the buried layer and of the outer sinker structures is higher than a basic doping in the process layer grown epitaxially on the base substrate by at least one order of magnitude.

The outer well may be connected to the potential of the central well, so that charge carriers injected into the base substrate can be removed harmlessly via the outer well in the diode structure in the case of a parallel-path current.

Figure 3:
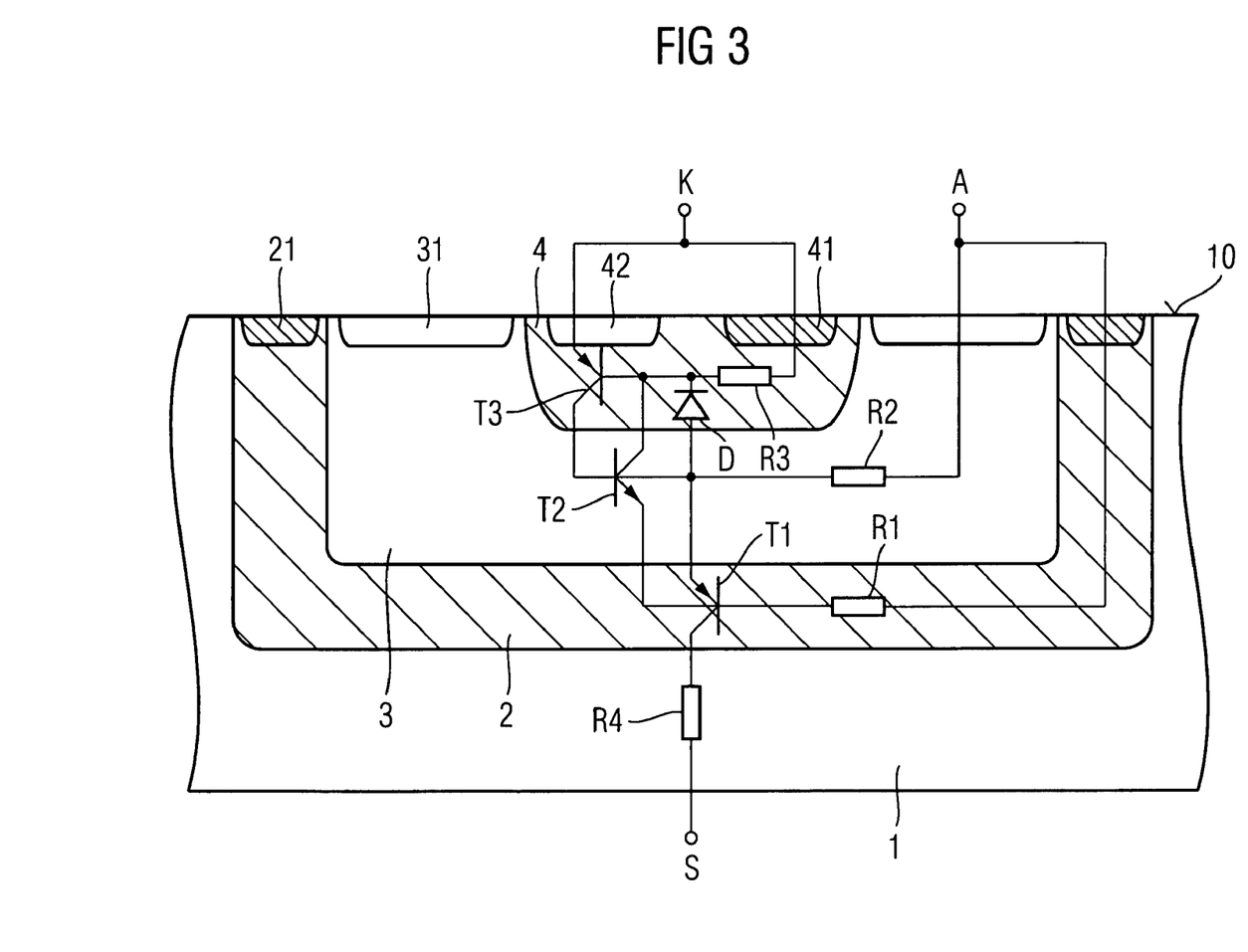
FIG. 3 illustrates a schematic cross section through a low-leakage diode, integrated into an integral power circuit arrangement, according to a first exemplary embodiment of the invention.

FIG. 3 illustrates a cross section of a first exemplary embodiment of the inventive diode structure. The cross section has been overlaid with an equivalent circuit diagram of the real diode structure.

A pn-junction D which determines the functionality of the diode structure is formed between an inner well 4 and a central well 3. The central well 3 is weakly p-doped, while the inner well 4 is n-doped. The structure formed from the two wells 3, 4 is formed within a further, highly n-doped outer well 2. The outer well 2 isolates the diode D formed within the outer well 2 from the surrounding semiconductor substrate 1. The semiconductor substrate 1 may contain further components which are limited by further n-wells. Within the wells 2, 3 and 4, outer 21, central 31 and first inner 41 contact regions are respectively formed in portions which adjoin a substrate surface 10 of the semi-conductor substrate 1. The contact regions respectively have a doping of the type in the surrounding well, but in a concentration or density which is at least one order of magnitude higher.

In comparison with the conventional diode structure described in FIG. 2, the diode structure in FIG. 3 additionally has a second contact region 42 in the region of the inner well 4, said second contact region having a doping of a conductivity type which is the opposite of the conductivity type of the inner well. In this case, the inner well 4 carries an n-doping. Correspondingly, the second inner contact region 42 has a doping of the p conductivity type.

The second inner contact region 42 and the central well 3 have an additional pnp-contact transistor T3 formed between them which can be actuated via the bulk resistance R3 in the inner well 4 and, in the case of ESD loading, responds in addition to a parasitic npn-well transistor T2. The injection of holes which a response from the pnp-contact transistor T3 entails results in displacement of the electrical field which develops as a result of the flow of current in the case of ESD loading into the depth of the semiconductor substrate 1 and results in the electrical field strength profile becoming shallower. The overall result is improved distribution of the local thermal loading in the semiconductor substrate which is brought about by the ESD loading.

Figure 4:
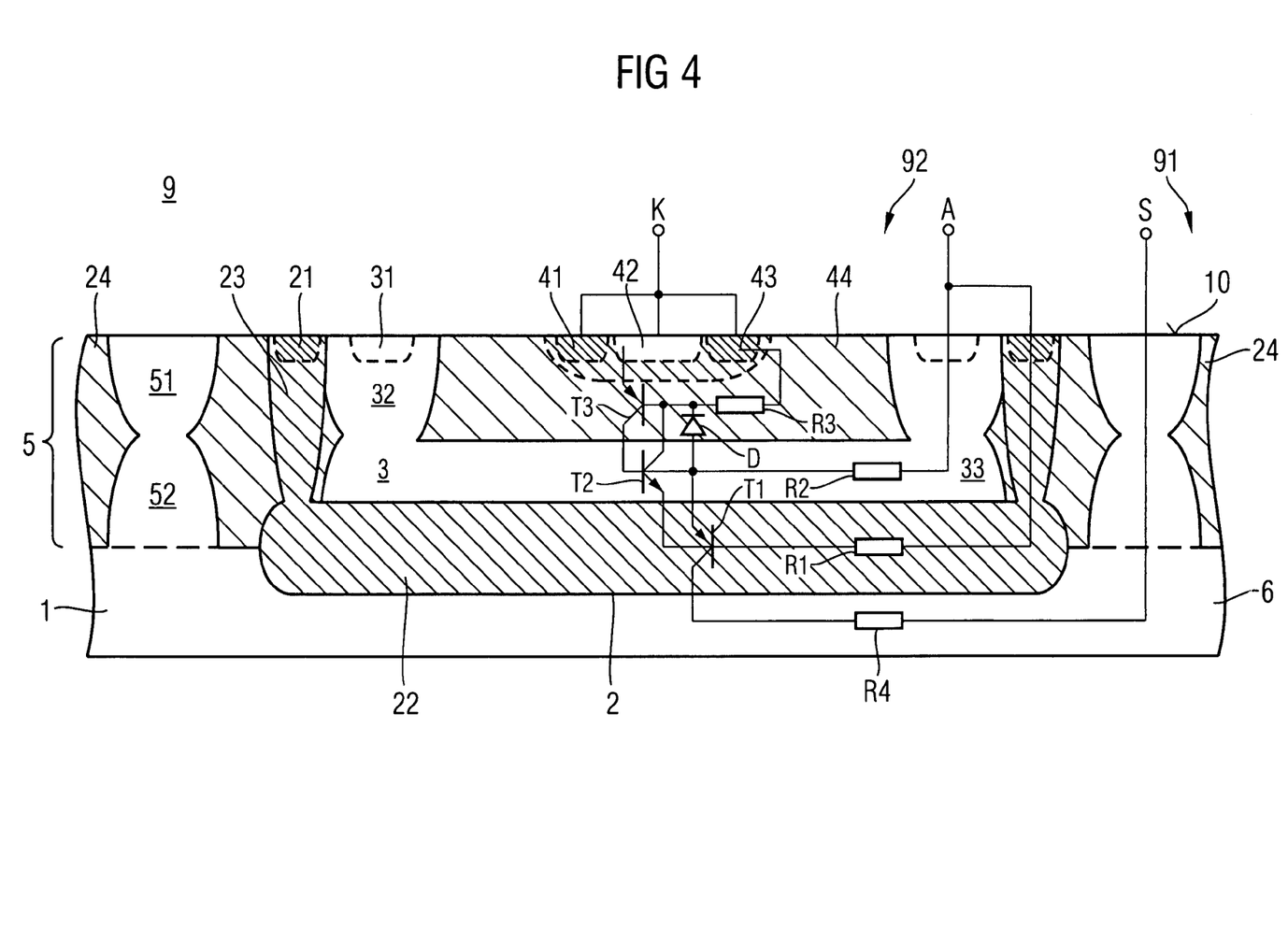
FIG. 4 illustrates a schematic cross section through a low leakage diode, integrated into an integral power switching arrangement, according to a second exemplary embodiment of the invention.

FIG. 4 gives a more detailed illustration of the diode structure which FIG. 3 shows in greatly simplified form. The diode structure 92 is formed in a semiconductor substrate 1 which comprises a weakly p-doped base substrate 6 and a weakly n-doped process layer 5 which is grown epitaxially on the base substrate 6. The outer well 2 comprises a buried layer 22 which is formed in a transition region between the base substrate 6 and the epitaxial layer 5, and outer sinker structures 23 which are made from a substrate surface 10 of the semiconductor substrate 1. Both the outer sinker structures 23 and the buried layer 22 have a doping which is higher than the doping of the epitaxial layer by at least the factor 10.

The central well 3 is made up of an inner layer 33 ($p_{bot}$) and vertical inner sinker structures 32 ($p_{top}$).

The inner well 4 comprises a portion of the unaltered epitaxial layer 5 as a base region 44. In the semiconductor substrate 1, the base region 44 encloses an n-conductive core region 43 which has a doping which is higher than the doping of the base region by at least the factor 10. In the semiconductor substrate 1, the core region 43 encloses n-conductive first inner contact regions 41 and p-conductive second inner contact regions. The n-conductive first inner contact region 41 has a doping which is higher than that of the core region 43 by at least the factor 10.

The outer well 2 of the diode structure 92 is isolated from neighboring further well structures 24, in which transistor structures 91 are formed, for example, by p-conductive isolating sinker structures 51, 52. The base substrate 6 is connected to a substrate connection S.

Figure 5A:
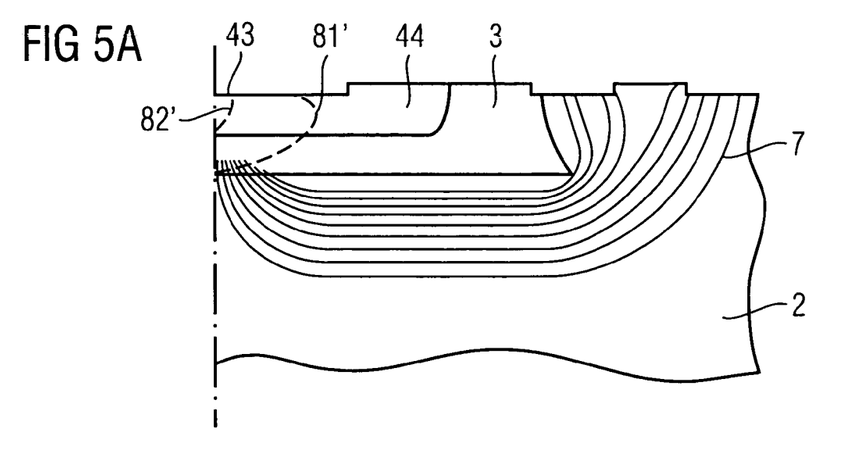
FIG. 5 illustrates the current-density and heat distribution in a conventional low leakage diode for various times after ESD loading has been applied.
Figure 5B:
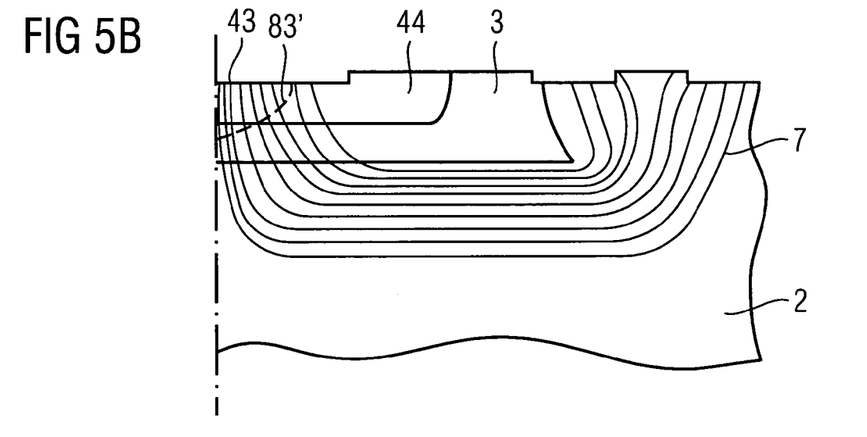
Figure 5C:
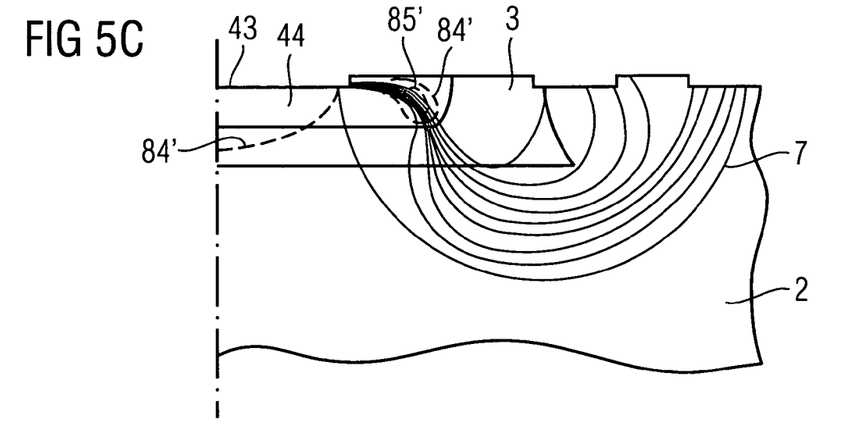

FIGS. 5A to 5C illustrate simulation results for the current-density and heat distribution in a conventional diode structure 2 nanoseconds, 8 nanoseconds and 12 nanoseconds, respectively, after a linear current ramp of 2 mA/µm/ns has been applied to the cathode connection and after a period of 5 nanoseconds in the region of the n-conductive core region 43 and of the n-conductive base region 44, of the adjacent p-conductive central well 3 and of the n-conductive outer well 2. The density of current path lines 7 corresponds to a current density which becomes established.

In FIG. 5A, a 300° isotherm 81' and a 340° isotherm 82' illustrate the temperature distribution in the semiconductor substrate 2 nanoseconds after the current ramp has been applied. From the profile of the 325° isotherm 83' in FIG. 5B after 8 nanoseconds and of the 325° isotherm 84' and of the 500° isotherm 85' after 12 nanoseconds, it is possible to see that the current distribution migrates in a temperature-dependent fashion laterally in the direction of the pn-junction between the n-doped base region 44 and the p-doped central well 3. This results in local overheating at that point, which leads to destruction of the diode structure.

FIGS. 6A to 6D illustrate simulation results corresponding to FIGS. 5A to 5C for the current-density and heat distribution in a diode structure according to an exemplary embodiment of the invention 2 nanoseconds, 8 nanoseconds, 12 nanoseconds and 50 nanoseconds, respectively, after the current ramp shown in FIG. 5 has been applied to the cathode connection.

Figure 6A:
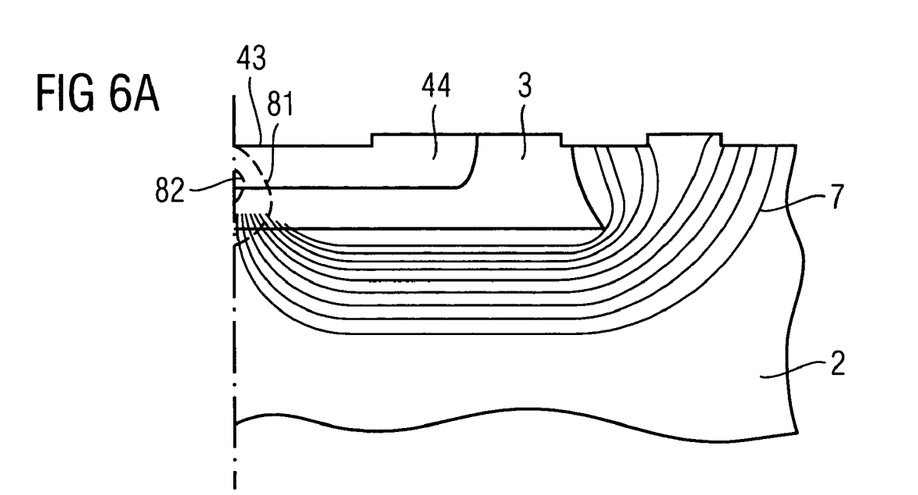
FIG. 6 illustrates the current-density and heat distribution for a low leakage diode according to a third exemplary embodiment of the invention at various times after ESD loading.
Figure 6B:
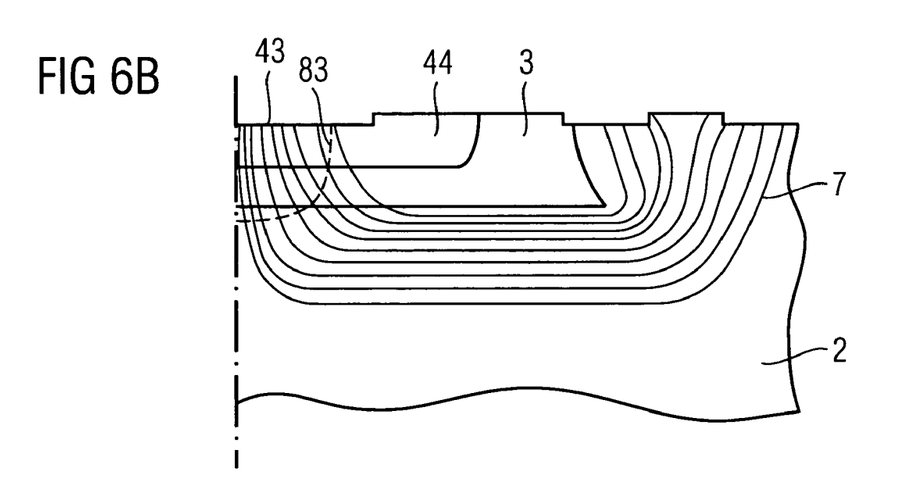
Figure 6C:
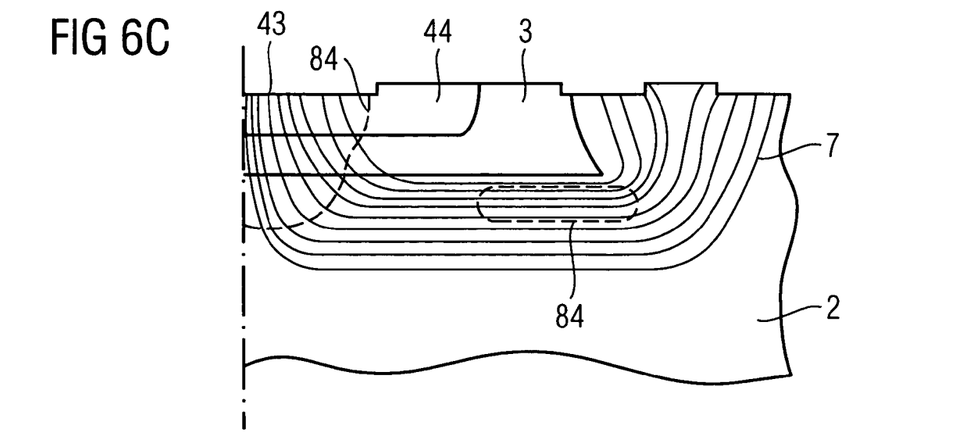
Figure 6D:
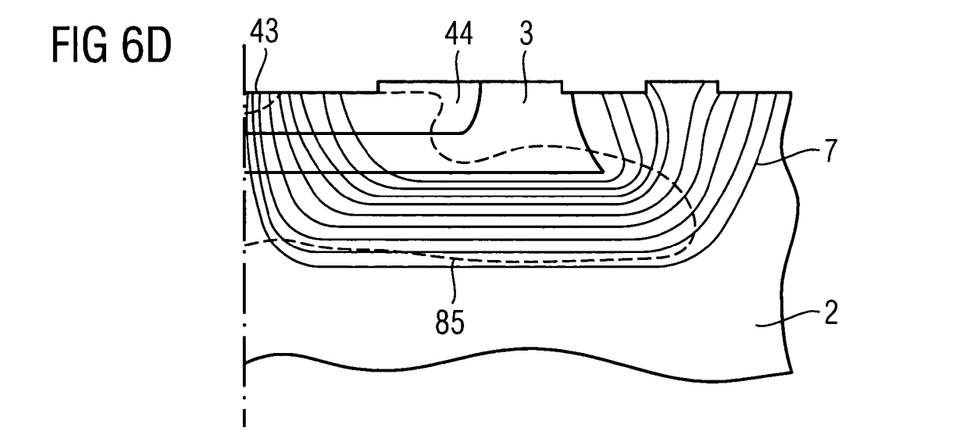

In this case, FIG. 6A shows a 300° isotherm 81 and a 311.6° isotherm 82, FIG. 6B shows the 300° isotherm 83, FIG. 6C shows the 300° isotherm 84 and FIG. 6D shows the 300° isotherm 85 and the 330° isotherm 86.

The distribution of the current path lines 7 changes little up to 50 nanoseconds after the current ramp has been applied. Accordingly, the heat is distributed comparatively evenly in the semiconductor substrate. In addition, FIG. 6A, in particular, reveals that a temperature maximum becomes established at a greater depth in the semiconductor substrate than in FIG. 5A, at which depth a better dissipation of heat is obtained than in regions which are close to the surface.

Figure 7A:
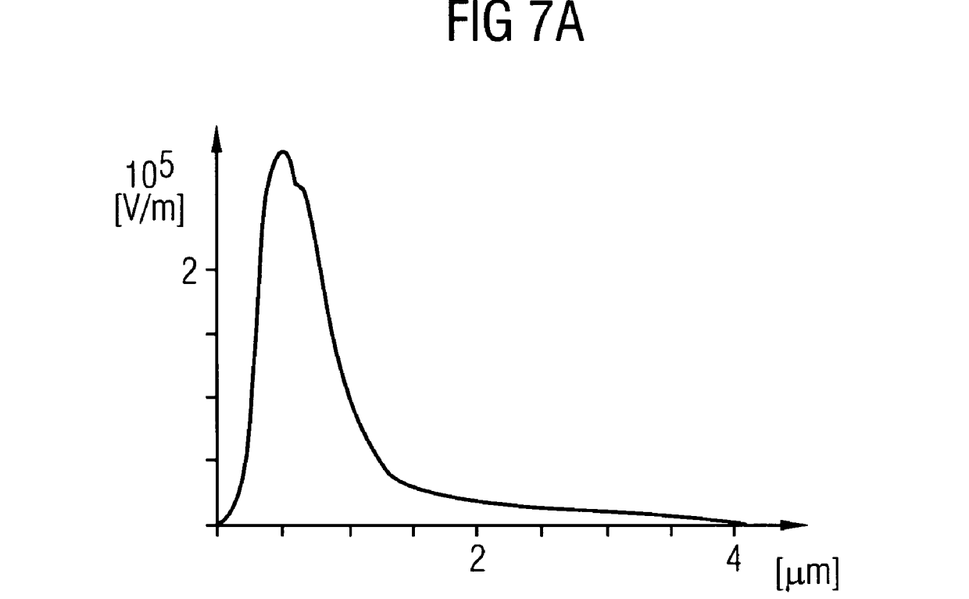
FIG. 7 illustrates graphs of the field-strength distribution following ESD loading in a conventional low leakage diode and a low leakage diode according to the third exemplary embodiment of the invention.
Figure 7B:
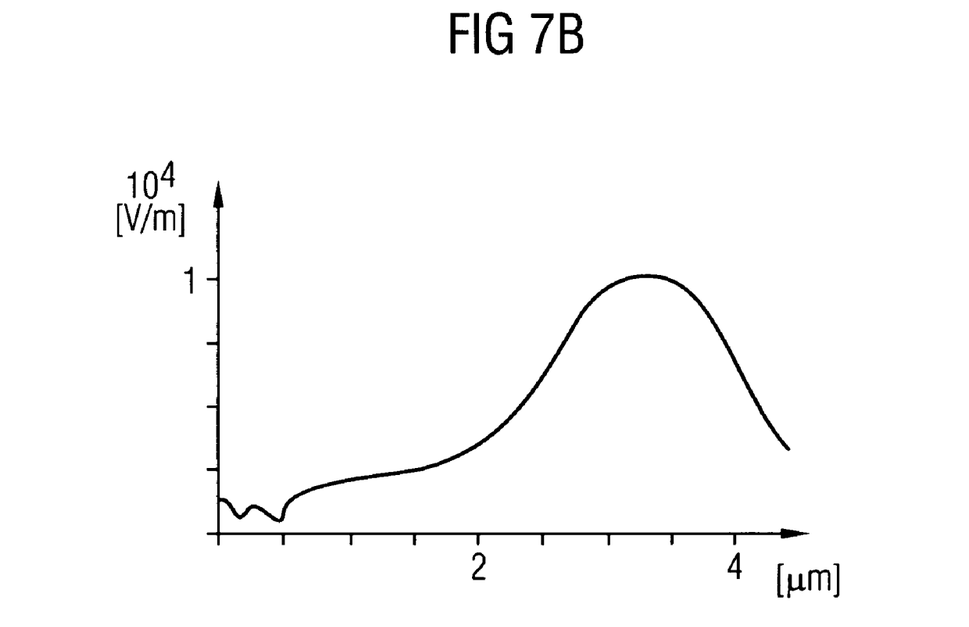

The graphs illustrated in FIGS. 7A and 7B illustrate the electrical field strength in the semiconductor substrate as a function of a distance from the substrate surface to the diode structures shown in FIG. 5 and FIG. 6 2 nanoseconds, respectively, after the current ramp shown in FIG. 5 has been applied.

Whereas the maximum field strength in a conventional diode structure as illustrated in FIG. 7A becomes established within a range of 200 to 700 nanometers below the substrate surface and achieves a maximum of above $2*10^5$ V/m, the field-strength profile in the diode structure in FIG. 6 is flattened and achieves a maximum of just approximately $10^4$ V/m at a comparatively great distance of 4 microns from the substrate surface.

The subsequent figures relate to the arrangement of the first and second inner contact regions with respect to one another. In all of the structures described, the first and second inner contact regions can be interchanged with one another in this context.

Figure 8A:
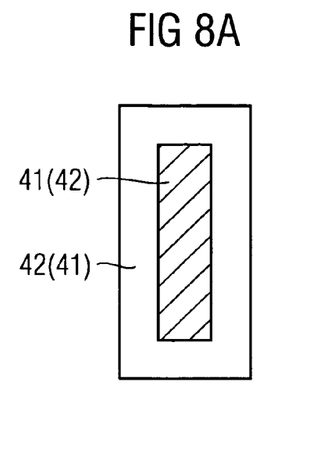
FIG. 8 illustrates schematic plan views of inner contact regions according to a further exemplary embodiment of the inventive diode structure.

FIG. 8A illustrates an exemplary embodiment of the inventive diode structure, in which a first inner contact region 41 is in rectangular form and is surrounded by a second inner contact region 42.

Figure 8B:
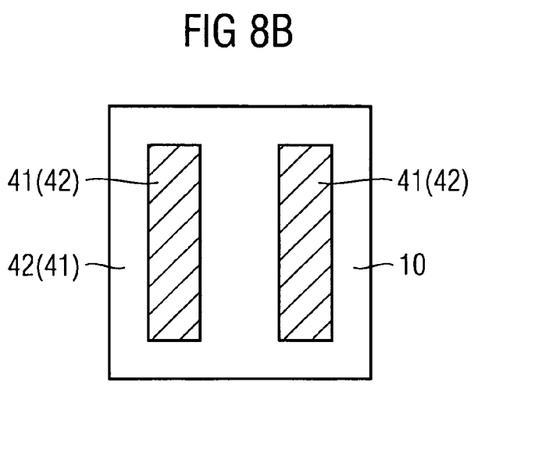

In the exemplary embodiment in FIG. 8B, two subregions of the first inner contact region 41 which are of similar design are enclosed by a second inner contact region 42. The structure in FIG. 8B can be extended by further subregions of the first inner contact region 41.

Figure 9A:
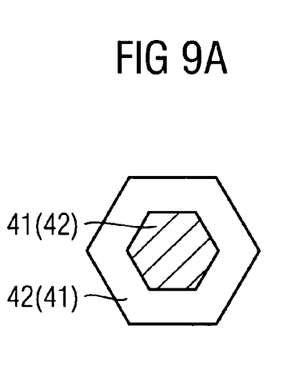
FIG. 9 illustrates schematic plan views of the inner contact structures according to a further exemplary embodiment of the inventive diode structure.

In FIG. 9A, the first inner contact region is in the form of a regular hexagon and is enclosed by the second inner contact region 42.

Figure 9B:
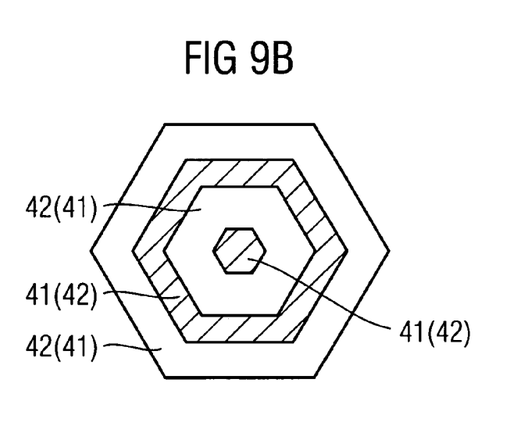

FIG. 9A can be extended by further subregions of the two inner contact regions 41, 42 as illustrated in FIG. 9B, which means that subregions of the two inner contact regions 41, 42 respectively alternate with one another.

Figure 9C:
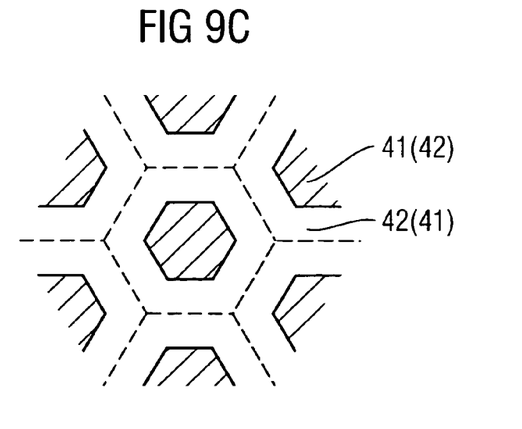

In line with FIG. 9C, the cell structure shown in FIG. 9A may be arranged so as to repeat itself in at least one surface area axis.

Figure 10A:
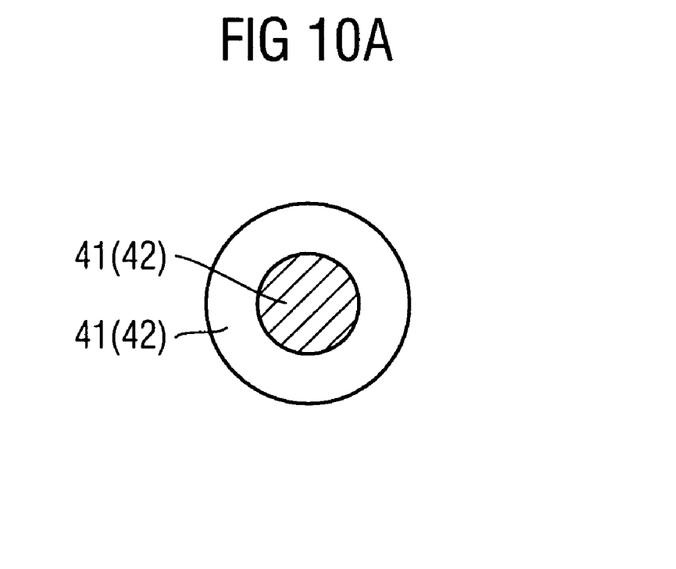
FIG. 10 illustrates schematic plan views of inner contact structures from further exemplary embodiments of the inventive low leakage diode.
Figure 10B:
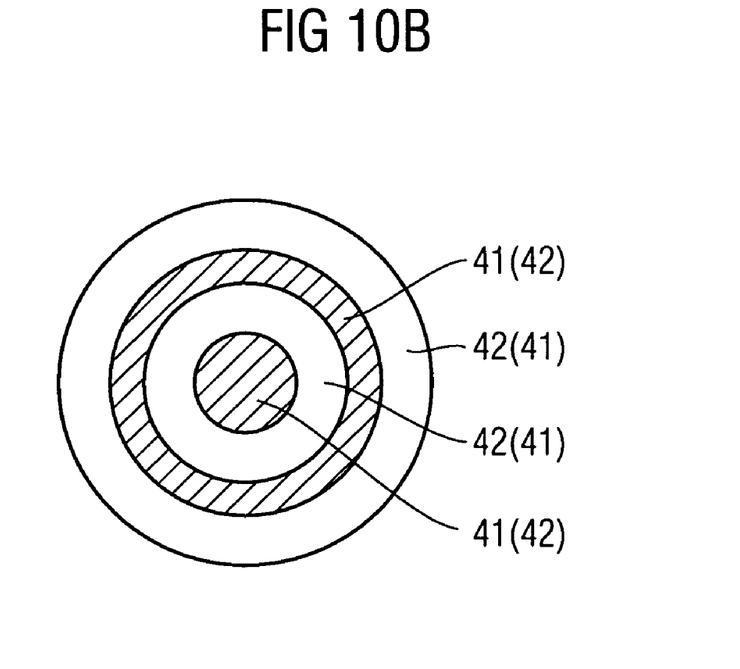

The arrangements shown in FIGS. 10A and 10B are based on the arrangements in FIGS. 9A and 9B, with the inner contact regions or the subregions of the inner contact regions being in circular or annular form.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A diode structure comprising:
   a first semiconductor region, formed in a semiconductor substrate, with a basic doping of a first conductivity type, a second semiconductor region, which adjoins the first semiconductor region, of a second conductivity type which is the opposite of the first conductivity type, a pn-junction, which determines the functionality of the diode structure, between the first and the second semiconductor region, and a third semiconductor region, which adjoins the second semiconductor region, of the first conductivity type;
   at least one first inner contact region, which is formed within the first semiconductor region and adjoins a substrate surface of the semiconductor substrate, with a contact doping of the first conductivity type which is higher than the basic doping, a base substrate of the second conductivity type which adjoins the third semiconductor region; and
   a first connection which is connected to the first semiconductor region in the region of the inner contact region, a second connection which is connected to the second semiconductor region, one of the connections being operated as a cathode connection and the other connection being operated as an anode connection, and the third semiconductor region being connected to the second connection, characterized by at least one second inner contact region of the second conductivity type which is formed within the first semiconductor region and is connected to the first connection.

2. The diode structure of claim 1, wherein the second inner contact region adjoins a substrate surface of the semiconductor substrate.

3. The diode structure of claim 1, wherein the first semiconductor region is in the form of at least one inner well which is enclosed in the semiconductor substrate by the second semiconductor region.

4. The diode structure of claim 1, wherein the second semiconductor region is in the form of at least one central well which is enclosed in the semiconductor substrate by the third semiconductor region.

5. The diode structure of claim 1, wherein the second inner contact region is surrounded, in a portion which adjoins the substrate surface, by the first inner contact region.

6. The diode structure of claim 1, wherein the first inner contact region is surrounded, in a portion which adjoins the substrate surface, by the second inner contact region.

7. The diode structure of claim 1, wherein the first and second inner contact regions respectively comprise a plurality of subregions, with a subregion of the first inner contact region and a subregion of the second inner contact region respectively forming a cell structure which is repeated in at least one of the surface area axes of the substrate surface.

8. The diode structure of claim 1, wherein at least the first or the second inner contact region respectively comprises a plurality of subregions, where, respectively starting from a first subregion of one of the two inner contact regions, a respective subregion of one inner contact region is successively surrounded by a subregion of the respective other inner contact region in the manner of a shell.

9. The diode structure of claim 1, wherein the first conductivity type is the n conductivity type.

10. A diode structure comprising:
   a first semiconductor region, formed in a semiconductor substrate, with a basic doping of a first conductivity type, a second semiconductor region, which adjoins the first semiconductor region, of a second conductivity type which is the opposite of the first conductivity type, a pn-junction, which determines the functionality of the diode structure, between the first and the second semiconductor region, and a third semiconductor region, which adjoins the second semiconductor region, of the first conductivity type;
   at least one first inner contact region, which is formed within the first semiconductor region and adjoins a substrate surface of the semiconductor substrate, with a contact doping of the first conductivity type which is higher than the basic doping, a base substrate of the second conductivity type which adjoins the third semiconductor region; and
   a first connection which is connected to the first semiconductor region in the region of the inner contact region, a second connection which is connected to the second semiconductor region, one of the connections being operated as a cathode connection and the other connection being operated as an anode connection, and the third semiconductor region being connected to the second connection, characterized by at least one second inner contact region of the second conductivity type which is formed within the first semiconductor region and is connected to the first connection,
   wherein the second inner contact region adjoins a substrate surface of the semiconductor substrate, and wherein the first semiconductor region is in the form of at least one inner well which is enclosed in the semiconductor substrate by the second semiconductor region.

11. The diode structure of claim 10, wherein the second semiconductor region is in the form of at least one central well which is enclosed in the semiconductor substrate by the third semiconductor region.

12. The diode structure of claim 11, wherein the second inner contact region is surrounded, in a portion which adjoins the substrate surface, by the first inner contact region.

13. The diode structure of claim 12, wherein the first inner contact region is surrounded, in a portion which adjoins the substrate surface, by the second inner contact region.

14. The diode structure of claim 13, wherein the first and second inner contact regions respectively comprise a plurality of subregions, with a subregion of the first inner contact region and a subregion of the second inner contact region respectively forming a cell structure which is repeated in at least one of the surface area axes of the substrate surface.

15. The diode structure of claim 13, wherein at least the first or the second inner contact region respectively comprises a plurality of subregions, where, respectively starting from a first subregion of one of the two inner contact regions, a respective subregion of one inner contact region is successively surrounded by a subregion of the respective other inner contact region in the manner of a shell.

16. A power switching arrangement comprising:
at least one transistor structure which is formed within a first well structure, which is supported by a base substrate of a second conductivity type, of a first conductivity type which is the opposite of the second conductivity type, a diode structure which is formed within a second well structure of the first conductivity type which is provided on the base substrate, and isolating structures of the second conductivity type which isolate the first and second well structures from one another and are vertical to the base substrate, wherein the diode structure formed in the second well structure comprises:
a first semiconductor region, formed in a semiconductor substrate, with a basic doping of a first conductivity type, a second semiconductor region, which adjoins the first semiconductor region, of a second conductivity type which is the opposite of the first conductivity type, a pn-junction, which determines the functionality of the diode structure, between the first and the second semiconductor region, and a third semiconductor region, which adjoins the second semiconductor region, of the first conductivity type;
at least one first inner contact region, which is formed within the first semiconductor region and adjoins a substrate surface of the semiconductor substrate, with a contact doping of the first conductivity type which is higher than the basic doping, a base substrate of the second conductivity type which adjoins the third semiconductor region; and
a first connection which is connected to the first semiconductor region in the region of the inner contact region, a second connection which is connected to the second semiconductor region, one of the connections being operated as a cathode connection and the other connection being operated as an anode connection, and the third semiconductor region being connected to the second connection, characterized by at least one second inner contact region of the second conductivity type which is formed within the first semiconductor region and is connected to the first connection,
and wherein the second well structure is formed by the outer well of the diode structure.

17. The power switching arrangement of claim 16, wherein the outer well is formed from a buried layer between a bottom edge of the central well and the underlying base substrate and from vertical outer sinker structures implanted from a substrate surface.

18. The power switching arrangement of claim 17, wherein the doping of the buried layer and of the outer sinker structures is higher than a basic doping in a process layer grown epitaxially on the base substrate.

19. A diode comprising:
a first semiconductor region with a basic doping of a first conductivity type, a second semiconductor region, of a second conductivity type which is the opposite of the first conductivity type, a pn-junction, which determines the functionality of the diode structure, between the first and the second semiconductor region, and a third semiconductor region of the first conductivity type;
at least one first inner contact region, which is formed within the first semiconductor region and adjoins a substrate surface of the semiconductor substrate, with a contact doping of the first conductivity type which is higher than the basic doping, a base substrate of the second conductivity type which adjoins the third semiconductor region;
a first connection which is connected to the first semiconductor region in the region of the inner contact region; and
at least one second inner contact region of the second conductivity type which is formed within the first semiconductor region and is connected to the first connection.

20. The diode structure of claim 19, wherein the first semiconductor region is in the form of at least one inner well which is enclosed in the semiconductor substrate by the second semiconductor region, and wherein the second semiconductor region is in the form of at least one central well which is enclosed in the semiconductor substrate by the third semiconductor region.

21. A diode comprising:
a first semiconductor region with a basic doping of a first conductivity type, a second semiconductor region, of a second conductivity type which is the opposite of the first conductivity type, a pn-junction, which determines the functionality of the diode structure, between the first and the second semiconductor region, and a third semiconductor region of the first conductivity type;
contact means, formed within the first semiconductor region and adjoins a substrate surface of the semiconductor substrate, with a contact doping of the first conductivity type which is higher than the basic doping, a base substrate of the second conductivity type which adjoins the third semiconductor region;
a first connection which is connected to the first semiconductor region in the region of the inner contact region; and
at least one second inner contact region of the second conductivity type which is formed within the first semiconductor region and is connected to the first connection.

* * * * *